United States Patent
Liou et al.

(10) Patent No.: US 9,304,389 B2
(45) Date of Patent: Apr. 5, 2016

(54) PHOTOMASK AND FABRICATION METHOD THEREOF

(71) Applicant: UNITED MICROELECTRONICS CORP., Hsin-Chu (TW)

(72) Inventors: En-Chiuan Liou, Tainan (TW); Sho-Shen Lee, New Taipei (TW); Wen-Liang Huang, Hsinchu (TW); Chang-Mao Wang, Tainan (TW); Kai-Lin Chuang, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 247 days.

(21) Appl. No.: 14/067,986

(22) Filed: Oct. 31, 2013

(65) Prior Publication Data

US 2015/0118602 A1    Apr. 30, 2015

(51) Int. Cl.
*G03F 1/68*    (2012.01)
*G03F 1/00*    (2012.01)

(52) U.S. Cl.
CPC ... *G03F 1/00* (2013.01); *G03F 1/68* (2013.01)

(58) Field of Classification Search
CPC .................................. G03F 1/68; G03F 7/20
USPC ............................................................. 430/5
See application file for complete search history.

(56) References Cited

U.S. PATENT DOCUMENTS

| 6,013,395 | A | 1/2000 | Matsuura |
| 6,913,858 | B2 * | 7/2005 | Kim ................................ 430/5 |
| 7,598,007 | B2 | 10/2009 | Yamamoto |
| 2004/0241555 | A1 | 12/2004 | Sheu |
| 2008/0090157 | A1 | 4/2008 | Chung |
| 2012/0107731 | A1 | 5/2012 | Tseng |

OTHER PUBLICATIONS

Mask 3D effects: impact on Imaging and Placement, Jo Finders and Thijs Hollink, BACUS, vol. 27, Issue 9, Sep. 2011.

* cited by examiner

*Primary Examiner* — Stephen Rosasco
(74) *Attorney, Agent, or Firm* — Winston Hsu; Scott Margo

(57) ABSTRACT

A photomask including first opaque patterns and second opaque patterns is provided. The first opaque patterns are distributed in a first plane defined in the photomask, while the second opaque patterns are disposed above the first opaque patterns and spaced apart from the first opaque patterns. In other words, the first opaque pattern and second opaque pattern are not distributed in the same plane.

20 Claims, 6 Drawing Sheets

PHOTOMASK AND FABRICATION METHOD THEREOF

BACKGROUND OF THE INVENTION

1. Field of the Invention

The present invention generally relates to the field of photomasks applied in the manufacture of electronic devices, and more particularly to photomasks employed to fabricate integrated circuits having small features sizes.

2. Description of the Prior Art

As the integrated circuit (IC) manufacturing industry moves towards smaller device dimensions, the resolution enhancement techniques (RET) for optical lithography such as off-axis illumination (OAI), optical proximity correction (OPC) and the phase-shifting mask (PSM) have been implemented in conjunction with reducing the wavelength of optical exposure.

Currently, in order to further increase the depth-of-focus (DOF) during a photolithography process, layout patterns disposed on the photomasks are often designed to have different thicknesses. In this way, the optical path between the layout patterns on the photomasks and a layer on a substrate to be printed with the layout patterns may be adjusted. Accordingly, the DOF corresponding to certain regions of the layout pattern may be increased so as to increase the exposure resolution during the photolithographic process.

However, there are still some optical problems, such as flares and distortions, which cannot be solved effectively even if the photomasks are designed to have the layout patterns in different thicknesses. As a result, how to fabricate photomasks capable of overcoming these optical problems is still a big issue nowadays.

SUMMARY OF THE INVENTION

One object of the present invention is to overcome the problems encountered in the prior art and to provide a photomask used in a photolithography process.

To this end, according to one embodiment of the present invention, a photomask including first opaque patterns and second opaque patterns is provided. The first opaque patterns and the second opaque patterns are not in the same plane and are spaced apart from each other.

According to another embodiment of the present invention, a method for fabricating a photomask is provided and at least includes the following steps. First opaque patterns are formed in a first plane by depositing a first opaque material in the beginning of the method. Then, second opaque patterns are formed above and spaced apart from the first opaque patterns by depositing a second opaque material. The first opaque patterns and the second opaque patterns are not in the same plane and are spaced apart from each other.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
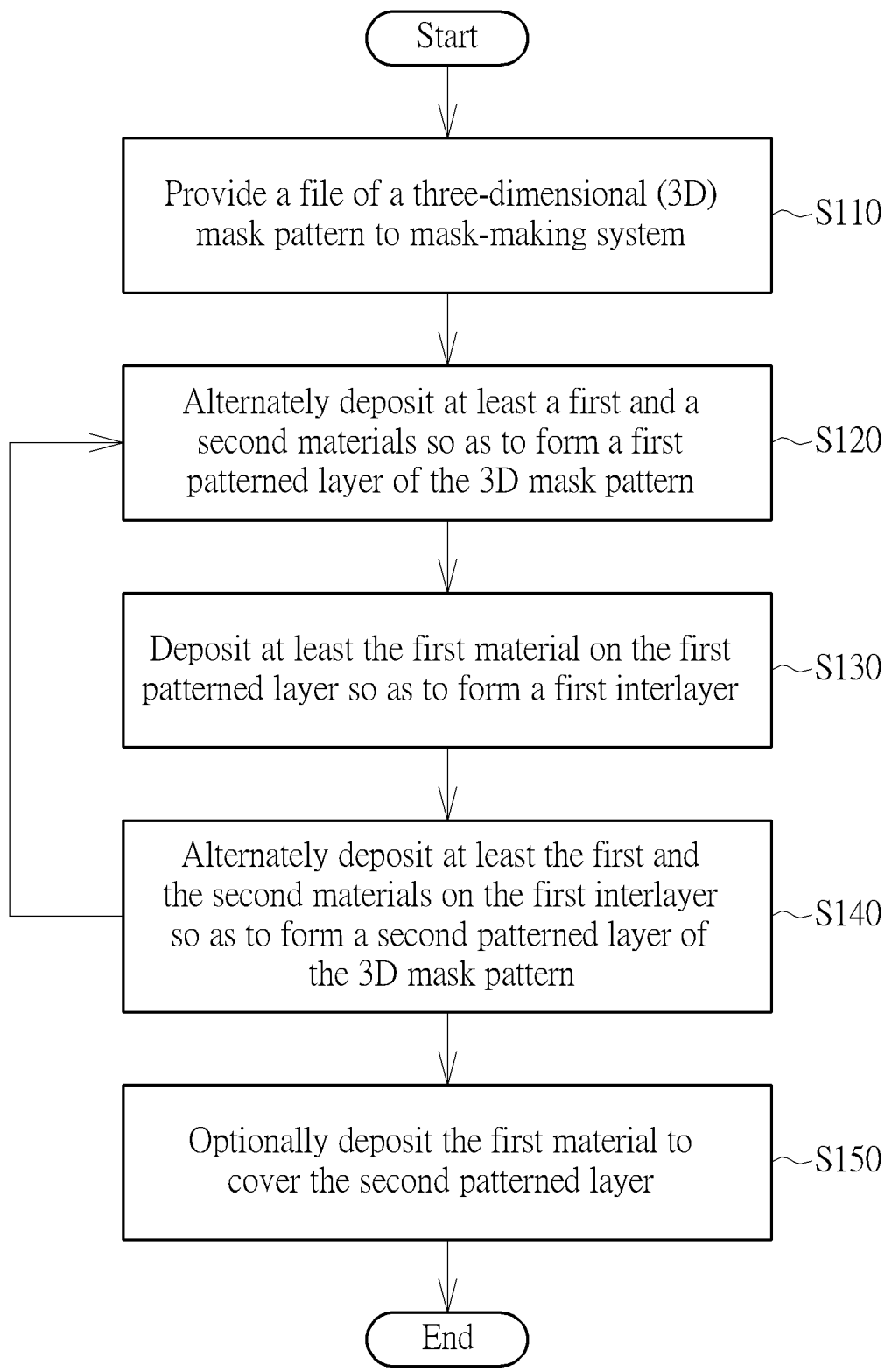
FIG. 1 is a simplified flow chart showing a method for fabricating a photomask according to a first embodiment of the present invention.

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

Figure 3:
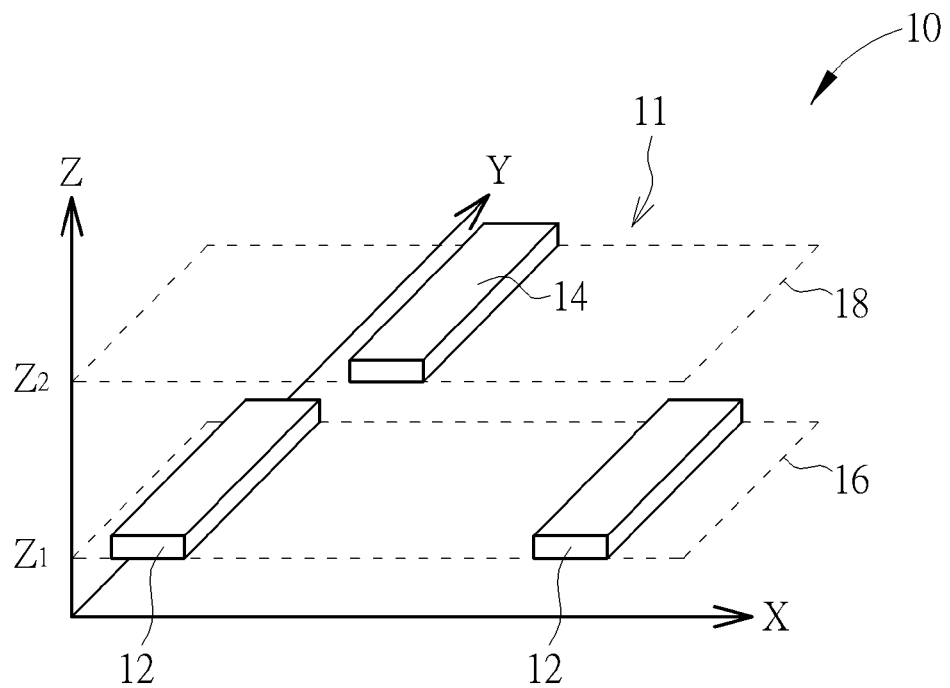
FIG. 3 is a schematic perspective view showing a three-dimensional (3-D) mask pattern stored in a computer system.

Please refer to FIGS. 1 and 3. FIG. 1 is a simplified flow chart showing a method for fabricating a photomask according to a first embodiment of the present invention. FIG. 3 is a schematic perspective view showing a three-dimensional (3-D) mask pattern stored in a computer system. As shown in FIG. 3, an electronic file 10 of a 3-D mask pattern 11 is transmitted from a computer system, for example, a computer-aided-design (CAD) system to a mask-making system during step S110. The 3-D mask pattern 11 is a pattern consisting of several geometric patterns 12, 14 and 16 and is generated corresponding to a two-dimensional (2-D) design layout representing a level of an integrated circuit (IC). Precisely, processes for generating the 3-D mask pattern 11 may include the following steps. First, a circuit design of an IC in electronic form is received by a CAD system. The circuit design may be created by circuit designers in an IC design house and may be mainly composed of elements such as contact plugs, contact slots, vias and interconnection lines used to electrically connect active devices within the IC. Then, the received circuit design is then calculated by the CAD system and translated to several 2-D design layouts that represent various levels of the IC. In this step, a slicing algorithm may be used for generating these 2-D design layouts. The development of a specific slicing algorithm for such purpose is well known within the skill of those in the art. In detail, the individual 2-D design layouts may include several 2-D geometric patterns such as straight lines, bent lines, trench, circles and/or polygons. Afterwards, in order to facilitate the following photolithography process, the individual 2-D design layouts, which consist of 2-D geometric patterns with relatively small feature sizes, may be further translated to the corresponding 2-D design layouts in which 2-D geometric patterns with relatively large feature sizes are generated. In detail, the positions of the translated 2-D geometric patterns usually correspond to those of the original 2-D geometric patterns. Since the translation of design layout is widely applied in the field of sidewall image transfer (SIT) technology and is well-known to those skilled in the art, the detailed description of which is therefore omitted for the sake of clarity.

Subsequently, the translated 2-D geometric patterns may be further simulated and corrected through specific simulation and correction software. For example, the contours, as well as the vertical positions, of the translated geometric patterns may be adjusted through the simulation and the correction. As a result, a 3-D design layout 11 consisting of geometric patterns 12 and 14 is generated and stored in the electronic file 10 as shown in FIG. 3. Preferably, during the simulation and the correction, various factors that could affect dimensions and contours of geometric patterns to be translated to a layer over a substrate are considered and are regarded as parameters to adjust and/or correct the contours and the vertical positions of the corresponding geometric patterns in the translated 2-D design layout. In detail, these factors include densities of patterns, shapes of patterns, film thickness uniformity, and substrate topography, but not limited thereto. Referring to FIG. 3, the geometric patterns 12 and 14 are preferably respectively located in planes with different axis values, e.g., planes 16 and 18 with axis values of $Z_1$ and $Z_2$ respectively. It should be noted that the geometric patterns may also be adjusted to be in more than two planes with different heights according to various requirements.

Figure 4:
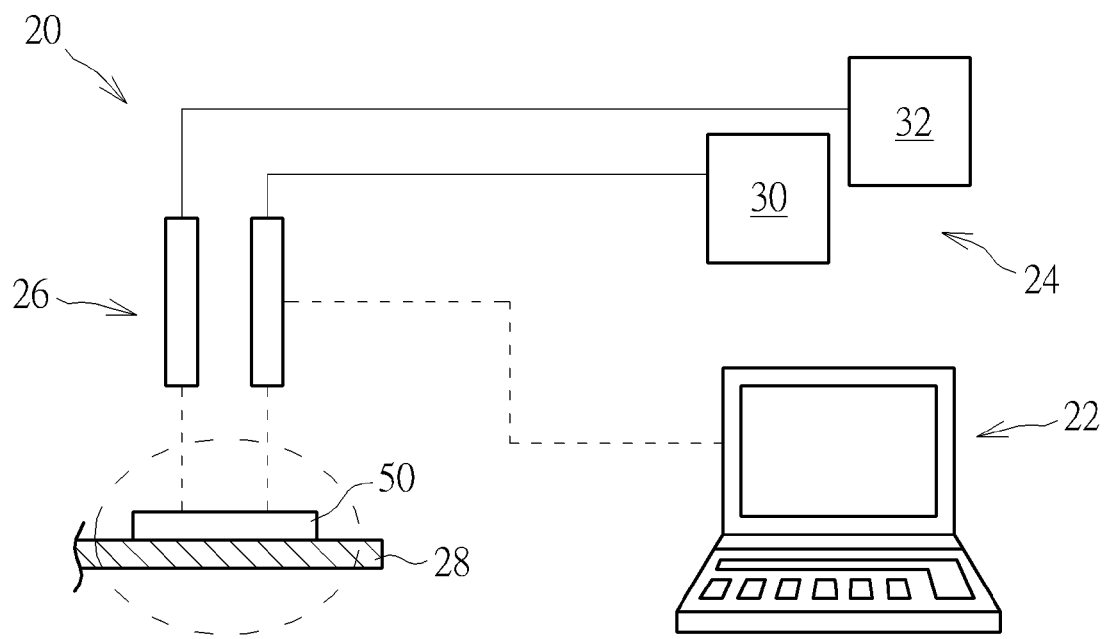
FIG. 4 is a schematic diagram showing mask-making equipment applied in a mask-making system according to a first embodiment of the present invention.

At the end of step S110, the electronic file 10 is sent to a mask-making system which may be then operated to fabricate a photomask including the 3-D mask pattern. Please refer to FIG. 4. FIG. 4 is a schematic diagram showing mask-making equipment applied in a mask-making system according to a first embodiment of the present invention. Referring to FIG. 4, according to one embodiment of the present invention, equipment 20 mainly includes a computer system 22, a cartridge system 24, printing heads 26, and a support tray 28. Preferably, the equipment 20 shown in FIG. 4 may be equipment applied in 3-D ink-jet printing technique. The cartridge system 24 may at least include at least two cartridges 30 and 32 in which two types of materials used to construct photomasks are respectively stored. The printing heads 26 are respectively connected to the cartridges 30 and 32 through pipes and may be moved in predetermined routes defined by the computer system 22. The purpose of the printing heads 26 is to properly provide the materials stored in the cartridges 30 and 32 to predetermined regions so as to form a required photomask 50 on the support tray 28. During a fabrication process for the photomask, the computer system 22 may be used to receive the electronic file 10 and correspondingly transmit command signals to the cartridge system 24, the printing heads 26, and the support tray 28 so as to enable the operation of these components.

Figure 5:
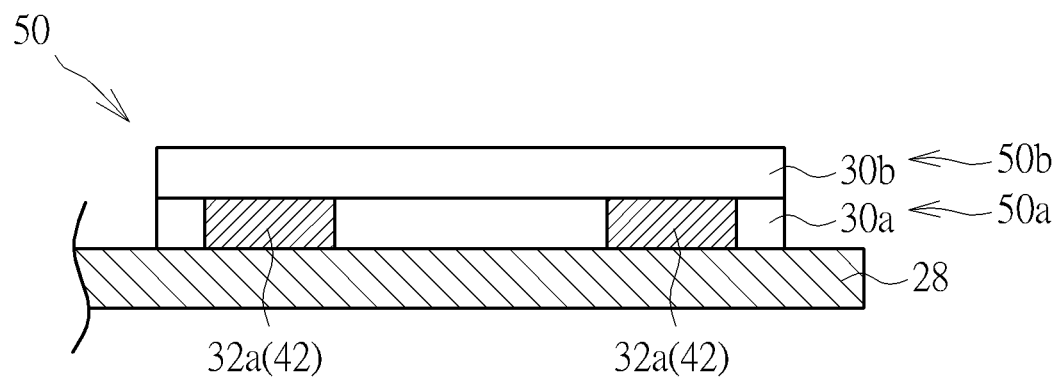
FIGS. 5 to 6 are schematic diagrams showing a method for fabricating a photomask according to a first embodiment of the present invention.
Figure 6:
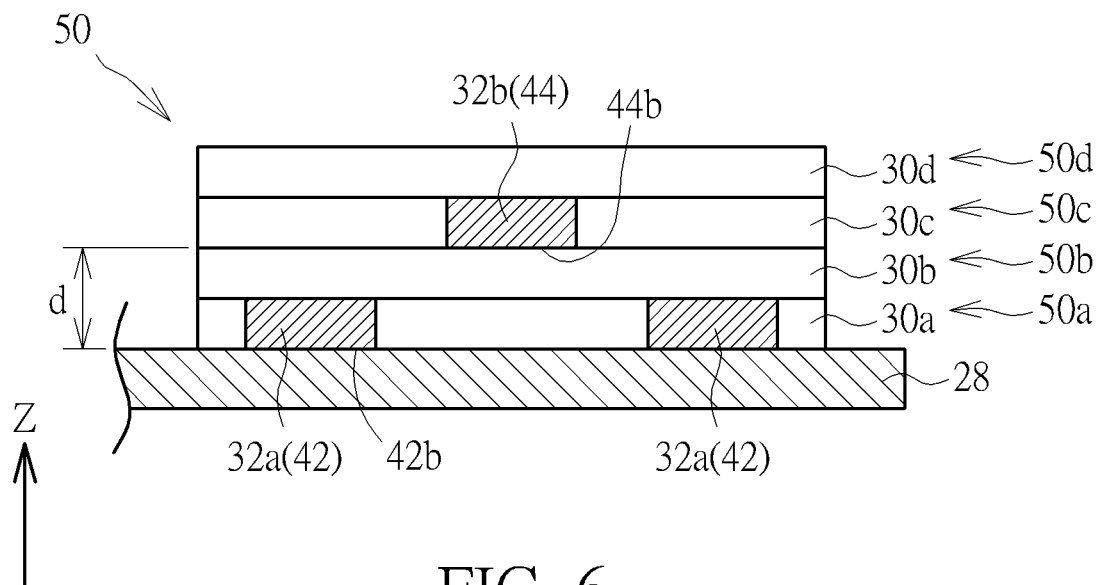

Please refer to FIGS. 4 to 6. In the following paragraphs, steps for fabricating a photomask according to a first embodiment of the present invention are described in detail. In step S120, at least two materials with different compositions are alternately deposited on the support tray 28 through the printing heads 26 so as to constitute a first patterned layer 50a of the 3-D mask pattern. For example, the first patterned layer 50a may include first opaque patterns 42 made of a first material 32a and optional first transparent patterns (not shown) made of a second material 30a. Preferably, the first opaque patterns 42 are distributed in a plane, e.g., an X-Y plane, and the first transparent patterns are in proximity to the first opaque patterns 42. According to a first embodiment of the present invention, the first patterned layer 50a has an almost flat top surface, but not limited thereto. Precisely, the materials originally deposited on the support tray 28 may be in wet form or dry form depending on different requirements. For example, for a case where the materials are in wet form, these materials may be jetted from printing heads 26 (also called jet heads) and solidified through curing or suitable chemical reaction. For another case where the materials are in dry form, these materials may be sintered by a suitable laser sintering process. The compositions of the first opaque patterns 42 may be chosen from chromium, chromium oxide ($CrO_x$) and tungsten silicide ($WSi_x$), while the compositions of the first transparent patterns may be chosen from quartz ($SiO_2$), calcium fluoride ($CaF_2$), and magnesium fluoride ($MgF_2$), but not limited thereto.

After step S120 is finished, in step S130, an interlayer 50b is formed on the surface of the first patterned layer 50a by depositing a material 30b similar to the second material 30 used in step S120. In this way, the interlayer 50b may cover both the first opaque patterns 42 and the first transparent patterns (not shown). It should be noted that the material used to form interlayer 50b is not restricted to be the material 30b similar to the second material 30. In other cases, there may be other transparent materials suitable for constituting photomasks. Similarly, the material 30b used to form interlayer 50b may be in wet form or dry form depending on different requirements. For example, for a case where the materials are in wet form, these materials may be jetted from printing heads 26 (also called jet heads) and solidified through curing or suitable chemical reaction. For another case where the materials are in dry form, these materials may be sintered by a suitable laser sintering process.

Alternatively, although the first transparent patterns (not shown) in the first patterned layer 50a and the interlayer 50b are deposited in different steps, it should be noted that they may be deposited during the same deposition step and therefore made of the same material. For example, after the formation of the first opaque patterns, the second material may be jetted from the printing heads and deposited in proximity to the first opaque patterns. As a result, both the first transparent patterns and the interlayer made of the same material are formed in the same step.

Referring to FIG. 6, in step S140, materials 32b and 30c are alternately deposited over the support tray 28 through the printing heads 26 so as to constitute a second patterned layer 50c of the 3-D mask pattern 50. For example, the second patterned layer 50c may include second opaque patterns 44 made of the material 32b similar to the first material 32 and second transparent patterns (not shown) made of the material 30c similar to the second material 30. The second transparent patterns are in proximity to the second opaque patterns 42. According to a first embodiment of the present invention, the second opaque patterns 44 in the second patterned layer 50c are spaced apart from and do not overlap the first opaque patterns 42 in the first patterned layer 50a. That is to say, the first opaque patterns 42 and the second opaque patterns 44 are not distributed in the same plane. Additionally, the first opaque patterns 42 and the second opaque patterns 44 may have different thicknesses, pattern densities and/or dimensions, but not limited thereto. Preferably, a first distance d along the first orientation Z orthogonal to the X-Y plane is defined between bottom surfaces 44b of the second opaque patterns 44 and bottom surfaces 42b of the first opaque patterns 42, and the first distance d is greater than zero. Also, the materials used to form second patterned layer 50c are not restricted to be respectively similar to the first and the second materials 32a and 30a. In other cases, there may be other opaque and transparent materials suitable for constituting photomasks. The compositions of the second opaque patterns 44 may be chosen from chromium, chromium oxide ($CrO_x$) and tungsten silicide ($WSi_x$), while the compositions of the second transparent patterns may be chosen from quartz ($SiO_2$), calcium fluoride ($CaF_2$), and magnesium fluoride ($MgF_2$), but not limited thereto. Similarly, the materials used to deposit may be in wet form or dry form depending on different requirements. For example, for a case where the materials are in wet form, these materials may be jetted from printing heads 26 (also called jet heads) and solidified through curing or suitable chemical reaction. For another case where the materials are in dry form, these materials may be sintered by a suitable laser sintering process.

By carrying out steps S120, S130, and S140, a photomask consisting of the first patterned layer 50a, the interlayer 50b and the second patterned layer 50c can be obtained. In addition, in order to obtain more than two patterned layers in the photomask, steps S120, S130, and S140 may be carried out repeatedly so as to fabricate a photomask consisting of more than two patterned layers. For example, there may be a third opaque patterns disposed above the second opaque patterns and spaced apart from the second opaque patterns. In other words, the second opaque patterns and the third opaque patterns are formed in different planes. Optionally, in step S150, a transparent cover 50d may be further formed on the second patterned layer 50c through the similar depositing process.

Figure 2:
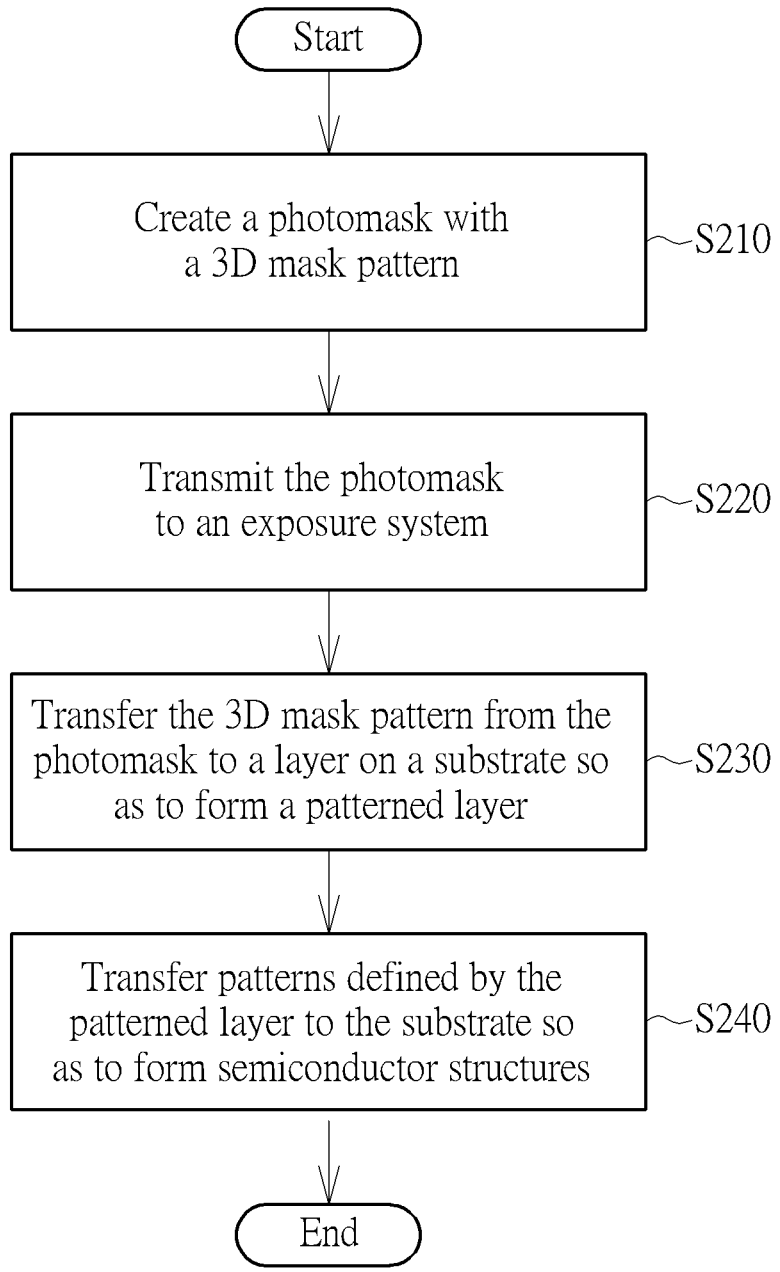
FIG. 2 is a simplified flow chart showing a method for transferring patterns from a photomask to a substrate according to a first embodiment of the present invention.
Figure 7:
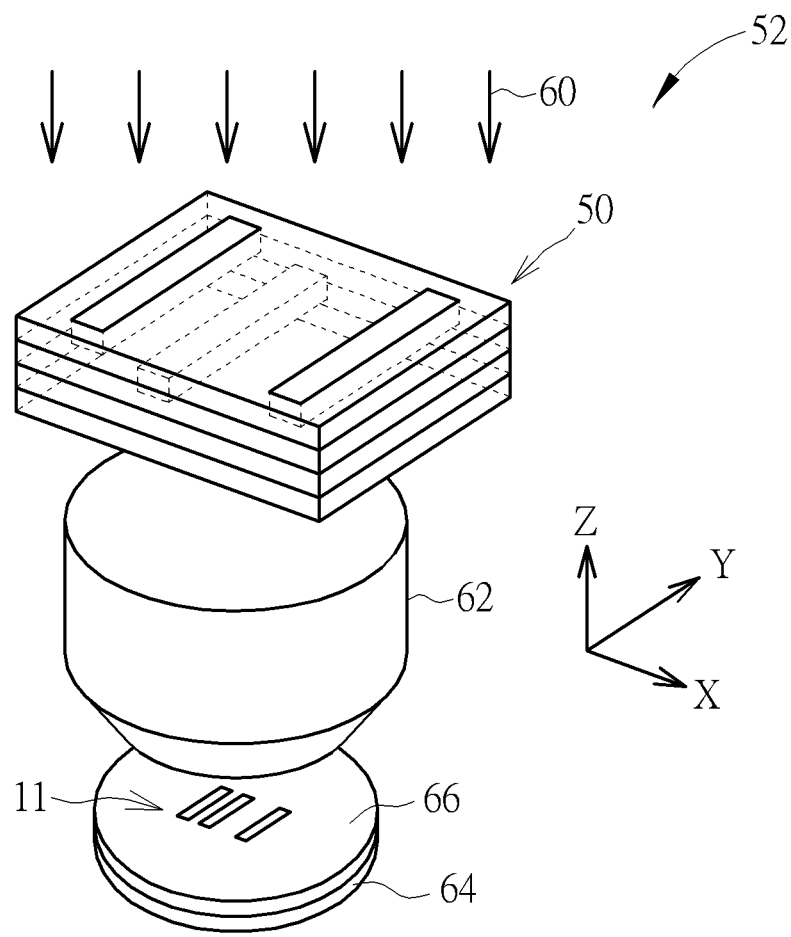
FIG. 7 is a schematic diagram showing a simplified exposure system according to one embodiment of the present invention.

According to the above description, the photomask 50 with the 3-D mask pattern is obtained through the suitable ink-jet printing or laser sintering processes. In the following process, the 3-D mask pattern may be further transferred to a wafer so as to obtain required semiconductor structures. Referring to FIGS. 2 and 7, FIG. 2 is a simplified flow chart showing steps for transferring patterns from a photomask to a substrate. FIG. 7 is a schematic diagram showing a simplified exposure system according to one embodiment of the present invention. In step S210, the photomask with the 3-D mask pattern is created, which may be similarly fabricated through steps S110 to S150. Referring to FIG. 7, in step S220, the photomask 50 is transmitted to an exposure system 52 consisting of a sophisticated optical system, such as a wafer stepper. By the use of a projection optical system 62 in the exposure system 52, the patterns of the photomask 50 may be scaled down proportionally and projected to a layer 66 over a substrate 64. According to the present embodiment, for example, the photomask 50 may be set above the projection optical system 62 and be radiated by light 60 with predetermined wavelength. During the exposure, in step S230, light 60 may pass through the photomask 50 and finally reach the layer 66. As a result, shrunk patterns 11 corresponding to the patterns of the photomask 50 may be formed in the layer 66. It should be noted that, although the patterns of the photomask 50 is distributed in planes with different axis values, e.g., Z-axis values, the shrunk patterns 11 formed in the layer 66 are preferably distributed in a same plane, e.g., in an X-Y plane. After the formation of the patterned layer, in step S240, the patterns may be further transferred to the underlying substrate 64 through suitable etching process so as to obtain required semiconductor structures. One characteristic of the first embodiment of the present invention is that the photomask 50 fabricated by the 3-D printing system or the like includes a 3-D mask pattern distributed in a space. As a result, the possible optical problems, such as flares or distortions, resulting from the use of conventional photomasks may be prevented or overcome by using the photomask 50 provided according to the embodiments of the present invention.

In addition to the above-mentioned first preferred embodiment, the present invention also includes other modified embodiments of photomasks. Since structures and the fabrication process in these modified embodiments are substantially similar to those disclosed in the first preferred embodiment, the following paragraphs will focus on the main difference among these embodiments and similar features will usually be described with same reference numerals for ease of illustration and description thereof. In addition, these embodiments are intended to be protected broadly within the spirit and scope of the appended claims.

Figure 8:
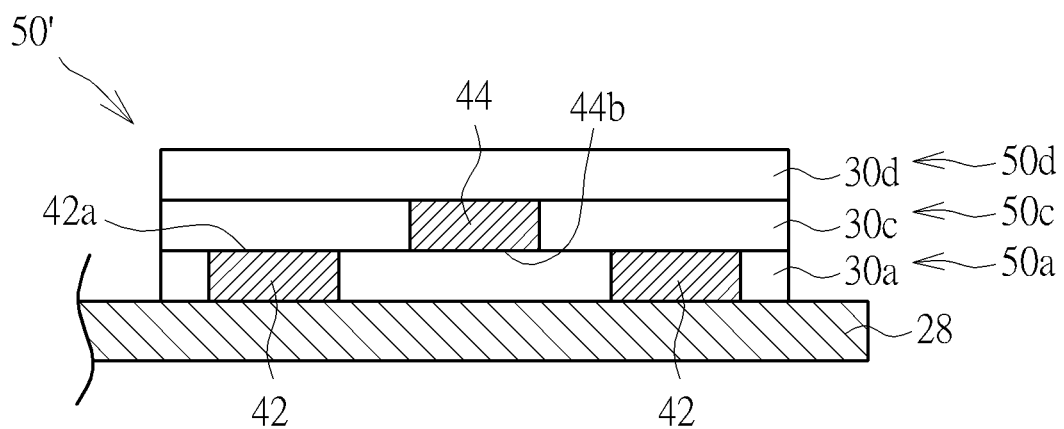
FIG. 8 is a schematic diagram showing a photomask according to a second embodiment of the present invention.

Please refer to FIG. 8, which is a schematic diagram showing a photomask according to a second embodiment of the present invention. Similar to FIG. 6, one main difference between these two embodiments is that the first patterned layer 50a and the second patterned layer 50c are adjacent to each other. In other words, the transparent interlayer is omitted according to the second embodiment of the present invention. Preferably, the bottom surfaces 44b of the second opaque patterns 44 are aligned with the top surfaces 42a of first opaque patterns 42. Apart from the absence of the transparent interlayer, the rest of the parts of the photomask 50' disclosed in this embodiment, such as positions of other parts, material properties and optical properties are almost similar to those shown in the photomask 50 according to the previous first preferred embodiment. For the sake of brevity, these similar configurations and properties are therefore not disclosed in detail.

Figure 9:
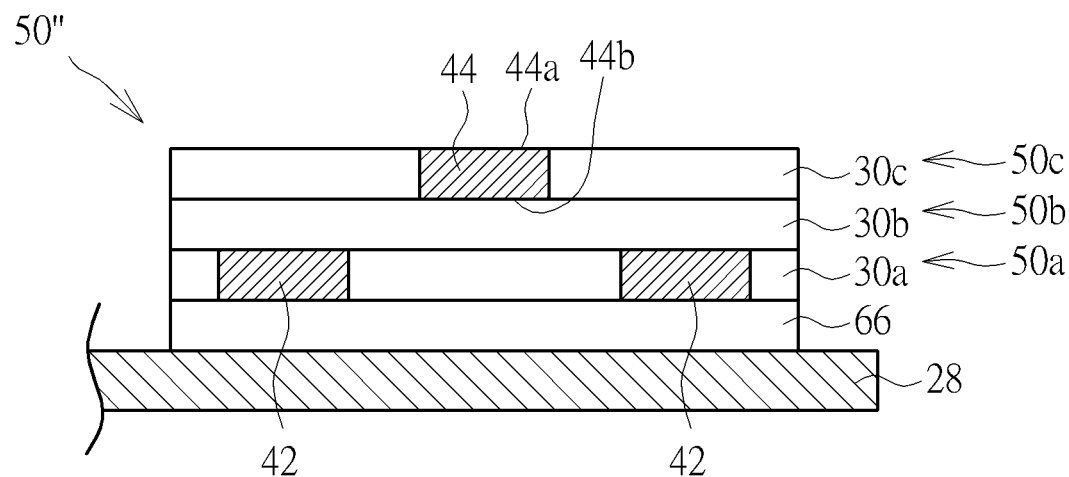
FIG. 9 is a schematic diagram showing a photomask according to a third embodiment of the present invention.

Please refer to FIG. 9, which is a schematic diagram showing a photomask according to a third embodiment of the present invention. Similar to FIG. 6, two main differences between these two embodiments are that the first patterned layer 50a is formed on a transparent substrate 66, such as quartz or the like, and the top surfaces 44a of the second opaque patterns 44 are not covered by the transparent cover 50d. Preferably, the top surfaces 44a of the second opaque patterns 44 are aligned with the top surfaces of second transparent patterns. Apart from the above-described differences, the rest of the parts of the photomask 50" disclosed in this embodiment, such as positions of other parts, material properties and optical properties are almost similar to those shown in the photomask 50 according to the previous first preferred embodiment. For the sake of brevity, these similar configurations and properties are therefore not disclosed in detail.

Figure 10:
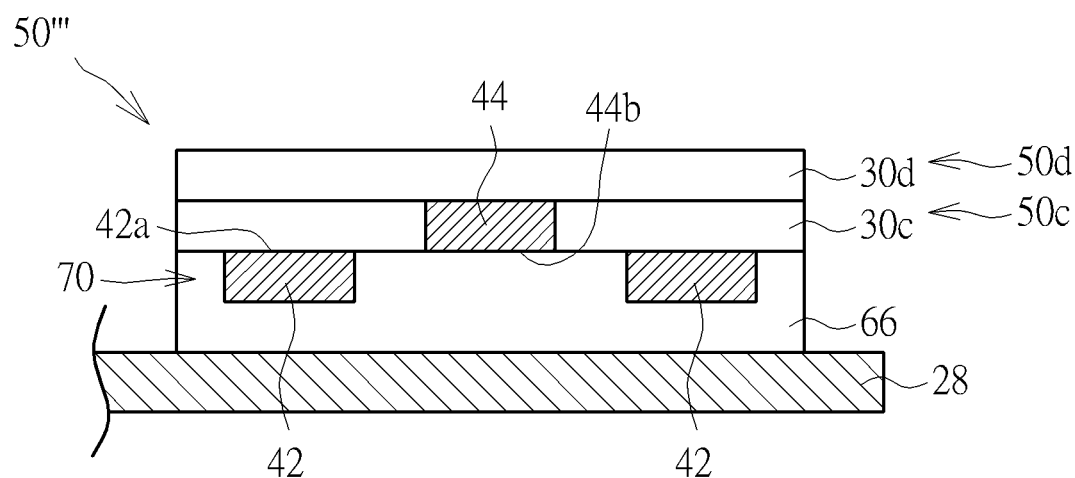
FIG. 10 is a schematic diagram showing a photomask according to a fourth embodiment of the present invention.

Please refer to FIG. 10, which is a schematic diagram showing a photomask according to a fourth embodiment of the present invention. Similar to FIG. 6, two main differences between these two embodiments are that the first opaque patterns 42 are respectively formed in recesses 70 on the surface of a transparent substrate 66, such as quartz or the like, and the first patterned layer 50a and the second patterned layer 50c are adjacent to each other. Preferably, the bottom surfaces 44b of the second opaque patterns 44 are aligned with the top surfaces 42a of first opaque patterns 42. Alternatively, if shallow recesses are formed on the top surfaces of transparent substrate to receive the corresponding second opaque patterns, the bottom surfaces of the second opaque patterns may be therefore lower than the top surfaces of first opaque patterns. Apart from the absence of the transparent interlayer and the existence of the recesses 70, the rest of the parts of the photomask 50''' disclosed in this embodiment, such as positions of other parts, material properties and optical properties are almost similar to those shown in the photomask 50 according to the previous first preferred embodiment. For the sake of brevity, these similar configurations and properties are therefore not disclosed in detail.

It should be noted that, in order to shift the phase of transmitted light by 180°, the opaque patterns of the photomask according to the embodiments of the present invention may be partially or totally replaced with translucent patterns made of molybdenum siliconoxynitride ($MoSi_xO_yN_z$) in accordance with different design requirements, but not limited thereto.

According to the embodiments of the present invention, the photomasks consisting of the opaque patterns and the transparent patterns may be fabricated by the use of 3-D printing techniques. It should be understood that, however, the photomasks may also be fabricated through semiconductor process. For example, an opaque film may be first deposited on the surface of the quartz substrate through atomic layer deposition (ALD). Afterwards, the opaque film is patterned through a photolithography and etching process so as to form the first opaque patterns. A transparent film may be then deposited so as to cover the substrate and the first opaque patterns. Subsequently, a planarization process, such as a chemical mechanical planarization (CMP) is carried out to planarize the top surface of the transparent film. According to different requirements, these processes may be carried out repeatedly until the required photomask is obtained.

To summarize, the embodiments of the present invention provide a photomask with 3-D mask patterns and a method for fabricating the same. 3-D mask patterns of the photomask may be fabricated by the use of 3-D printing techniques or the like. As a result, the possible optical problems, such as flares or distortions, resulting from the use of conventional photomasks may be prevented or overcome by using the photomask provided according to the embodiments of the present invention.

As described above, the highly reliable photomask with 3-D mask patterns, which is able to prevent or overcome conventional optical problems, such as flares or distortions, resulting from the use of conventional photomasks, can efficiently be manufactured. Therefore, the invention of the present application is widely applicable to the technical field relating to the semiconductor industry.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A photomask, comprising:
   a transparent substrate;
   a plurality of first opaque patterns distributed in a first plane; and
   a plurality of second opaque patterns disposed above the first opaque patterns and spaced apart from the first opaque patterns, wherein the first opaque pattern and second opaque pattern are not in the same plane, in addition, both the first opaque patterns and the second opaque patterns are disposed on a same side of the transparent substrate.

2. The photomask according to claim 1, further comprising a first transparent interlayer covering the first opaque patterns.

3. The photomask according to claim 1, wherein top surfaces of the first opaque patterns are aligned with bottom surfaces of the second opaque patterns.

4. The photomask according to claim 1, further comprising a plurality of first transparent patterns disposed in proximity to the first opaque patterns.

5. The photomask according to claim 4, wherein top surfaces of the first opaque patterns are aligned with top surfaces of the first transparent patterns.

6. The photomask according to claim 4, further comprising a first transparent interlayer covering the first opaque patterns and the first transparent patterns.

7. The photomask according to claim 1, wherein the transparent substrate further comprises a plurality of recesses disposed on a surface of the transparent substrate, and portions of the first opaque patterns are respectively disposed in the recesses.

8. The photomask according to claim 1, wherein top surfaces of the first opaque patterns are aligned with bottom surfaces of the second opaque patterns.

9. The photomask according to claim 1, further comprising a transparent cover overlaying the second opaque patterns.

10. The photomask according to claim 1, further comprising a plurality of third opaque patterns disposed above the second opaque patterns and spaced apart from the second opaque patterns, wherein the second opaque patterns and third opaque patterns are not distributed in the same plane.

11. A method for forming a pattern on a substrate, comprising transferring the first and second opaque patterns of the photomask according to claim 1 into a layer on the substrate.

12. A method for fabricating a photomask, comprising:
   providing a transparent substrate;
   depositing a first opaque material so as to form a plurality of first opaque patterns in a first plane; and
   depositing a second opaque material above the first opaque patterns so as to form a plurality of second opaque patterns spaced apart from the first opaque patterns, wherein the first opaque patterns and second opaque patterns are not in the same plane, in addition, both the first opaque patterns and the second opaque patterns are disposed on a same side of the transparent substrate.

13. The method according to claim 12, wherein top surfaces of the first opaque patterns are aligned with bottom surfaces of the second opaque patterns.

14. The method according to claim 12, further comprising depositing a first transparent material on the first opaque patterns so as to form a transparent interlayer.

15. The method according to claim 12, further comprising depositing a first transparent material so as to form a plurality of first transparent patterns disposed in proximity to the first opaque patterns.

16. The method according to claim 15, wherein top surfaces of the first opaque patterns are aligned with top surfaces of the first transparent patterns.

17. The method according to claim 15, further comprising depositing a first transparent material on the first opaque patterns and the first transparent patterns so as to form a transparent interlayer.

18. The method according to claim 12, wherein the transparent substrate further comprises a plurality of recesses disposed on a surface of the transparent substrate, and portions of the first opaque patterns are respectively disposed in the recesses.

19. The method according to claim 12, wherein top surfaces of the first opaque patterns are aligned with bottom surfaces of the second opaque patterns.

20. The method according to claim 12, further comprising depositing a first transparent material on the second opaque patterns so as to form a transparent cover.

* * * * *